United States Patent
Yang et al.

(10) Patent No.: US 10,257,844 B2
(45) Date of Patent: Apr. 9, 2019

(54) BEAM-COMBINING SCHEME WITH BROADCAST BEAM-SWEEPING AND BEAM-INDEX INDICATION

(71) Applicant: QUALCOMM Incorporated, San Diego, CA (US)

(72) Inventors: Yang Yang, San Diego, CA (US); Jing Jiang, San Diego, CA (US); Gabi Sarkis, San Diego, CA (US); Jamie Menjay Lin, San Diego, CA (US); Tao Luo, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 43 days.

(21) Appl. No.: 15/681,296

(22) Filed: Aug. 18, 2017

(65) Prior Publication Data

US 2018/0206244 A1  Jul. 19, 2018

Related U.S. Application Data

(60) Provisional application No. 62/447,363, filed on Jan. 17, 2017.

(51) Int. Cl.
*H04L 1/00* (2006.01)
*H04L 1/08* (2006.01)
(Continued)

(52) U.S. Cl.
CPC ......... *H04W 72/085* (2013.01); *H04L 1/0045* (2013.01); *H04L 1/08* (2013.01);
(Continued)

(58) Field of Classification Search
CPC .... H04B 7/0695; H04B 7/0617; H04B 7/088; H04W 16/28; H04W 72/042; H04W 72/046; H04W 74/006; H04W 74/0833
See application file for complete search history.

(56) References Cited

U.S. PATENT DOCUMENTS 7,218,689 B2    5/2007 Gupta
2011/0182385 A1  7/2011 Doan et al.
(Continued)

OTHER PUBLICATIONS

Huawei Hisilicon: "Unified single/multiple beam operations for initial access", 3GPP Draft; R1-1611667, 3rd Generation Partnership Project (3GPP), Mobile Competence Centre; 650, Route Des Lucioles; F-06921 Sophia-Antipolis Cedex; France, vol. RAN WG1, Reno, USA; Nov. 14, 2016-Nov. 18, 2016, Nov. 13, 2016 (Nov. 13, 2016), XP051175639, 10 pages, Retrieved from the Internet: URL: http://www.3gpp.org/ftp/Meetings_3GPP_SYNC/RAN1/Docs/ [retrieved on Nov. 13, 2016].

(Continued)

*Primary Examiner* — Nam T Huynh
(74) *Attorney, Agent, or Firm* — Linda G. Gunderson; Arent Fox

(57) ABSTRACT

Various features related to decoding jointly coded broadcast information and beam/symbol index information to achieve higher reliability and reduced decoding errors from the perspective of a receiving device such as a UE are described. In an aspect of the disclosure, a method, a computer-readable medium, and an apparatus are provided. The apparatus may be configured to receive a first beam and a second beam of a plurality of beams from a base station, the first beam including broadcast information and a first beam index information jointly encoded together, and the second beam including broadcast information and a second beam index information jointly encoded together, determine a first LLR of the first beam, determine a second LLR of the second beam, and decode the broadcast information and the first beam index information in the first beam based on both the first LLR and the second LLR.

30 Claims, 8 Drawing Sheets

(51) Int. Cl.
*H04W 16/28* (2009.01)
*H04W 72/00* (2009.01)
*H04W 72/04* (2009.01)
*H04W 72/08* (2009.01)
*H04B 7/06* (2006.01)
*H03M 13/37* (2006.01)
*H04W 88/02* (2009.01)
*H04W 88/08* (2009.01)

(52) U.S. Cl.
CPC ......... *H04W 16/28* (2013.01); *H04W 72/005* (2013.01); *H04W 72/046* (2013.01); *H03M 13/3769* (2013.01); *H04B 7/0695* (2013.01); *H04W 88/02* (2013.01); *H04W 88/08* (2013.01)

(56) References Cited

U.S. PATENT DOCUMENTS

| | | |
|---|---|---|
| 2011/0228883 A1 | 9/2011 | Liu et al. |
| 2014/0120926 A1 | 5/2014 | Shin et al. |
| 2016/0373180 A1* | 12/2016 | Guo .................. H04B 7/063 |
| 2017/0006593 A1 | 1/2017 | Liu |
| 2017/0041051 A1 | 2/2017 | Rahman et al. |
| 2017/0104517 A1 | 4/2017 | Kakishima et al. |
| 2017/0111886 A1* | 4/2017 | Kim .................. H04W 72/042 |

OTHER PUBLICATIONS

International Search Report and Written Opinion—PCT/US2018/012094—ISA/EPO—dated May 28, 2018.

\* cited by examiner

BEAM-COMBINING SCHEME WITH BROADCAST BEAM-SWEEPING AND BEAM-INDEX INDICATION

CROSS-REFERENCE TO RELATED APPLICATION(S)

This application claims the benefit of U.S. Provisional Application Ser. No. 62/447,363 entitled A BEAM-COMBINING SCHEME WITH BROADCAST BEAM-SWEEPING AND BEAM-INDEX INDICATION filed on Jan. 17, 2017, which is expressly incorporated by reference herein in its entirety.

FIELD

The present disclosure relates generally to communication systems, and more particularly, to methods and apparatus for more reliable decoding of broadcast information jointly coded with beam index.

BACKGROUND

Wireless communication systems are widely deployed to provide various telecommunication services such as telephony, video, data, messaging, and broadcasts. Typical wireless communication systems may employ multiple-access technologies capable of supporting communication with multiple users by sharing available system resources. Examples of such multiple-access technologies include code division multiple access (CDMA) systems, time division multiple access (TDMA) systems, frequency division multiple access (FDMA) systems, orthogonal frequency division multiple access (OFDMA) systems, single-carrier frequency division multiple access (SC-FDMA) systems, and time division synchronous code division multiple access (TD-SCDMA) systems.

These multiple access technologies have been adopted in various telecommunication standards to provide a common protocol that enables different wireless devices to communicate on a municipal, national, regional, and even global level. An example telecommunication standard is 5G New Radio (NR). 5G NR is part of a continuous mobile broadband evolution promulgated by Third Generation Partnership Project (3GPP) to meet new requirements associated with latency, reliability, security, scalability (e.g., with Internet of Things (IoT)), and other requirements. Some aspects of 5G NR may be based on the 4G Long Term Evolution (LTE) standard. There exists a need for further improvements in 5G NR technology. These improvements may also be applicable to other multi-access technologies and the telecommunication standards that employ these technologies.

Cellular systems typically employ periodic or frequent transmission of broadcast information, such as the Physical Broadcast Channel (PBCH) in LTE. It would be desirable to have methods and apparatus that would allow communicating additional useful information along with the broadcast information, and more robust decoding of such communicated information at a receiving device to achieve higher reliability.

SUMMARY

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its sole purpose is to present some concepts of one or more aspects in a simplified form as a prelude to the more detailed description that is presented later.

Cellular systems employ periodic or frequent transmission of broadcast information, e.g., such as the PBCH in LTE. In accordance with an aspect, in some configurations the broadcast information is communicated from transmitting device, e.g., a base station, through beam sweeping. In addition to the broadcast information, the base station may also transmit beam/symbol index information through the beams so that a receiving device upon the reception of a beam, may derive slot boundary (e.g., slot of subframe) or even frame (e.g., radio frame) boundary in addition to decoding the broadcast information.

Various configurations described herein are directed to methods and apparatus for improved communication of broadcast information along with beam index, which may be jointly coded. Various configurations are also directed to methods and apparatus for robust decoding of jointly coded broadcast information and beam index information to achieve higher reliability and reduced decoding errors from the perspective of a receiving device such as a user equipment (UE).

In an aspect of the disclosure, a method, a computer-readable medium, and an apparatus are provided. The apparatus may be configured to receive a first beam and a second beam of a plurality of beams from a base station, the first beam including broadcast information and a first beam index information jointly encoded together, and the second beam including broadcast information and a second beam index information jointly encoded together, determine a first log likelihood ratio (LLR) of the first beam, determine a second LLR of the second beam, and decode the broadcast information and the first beam index information in the first beam based on both the first LLR and the second LLR.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

DETAILED DESCRIPTION

Figure 1:
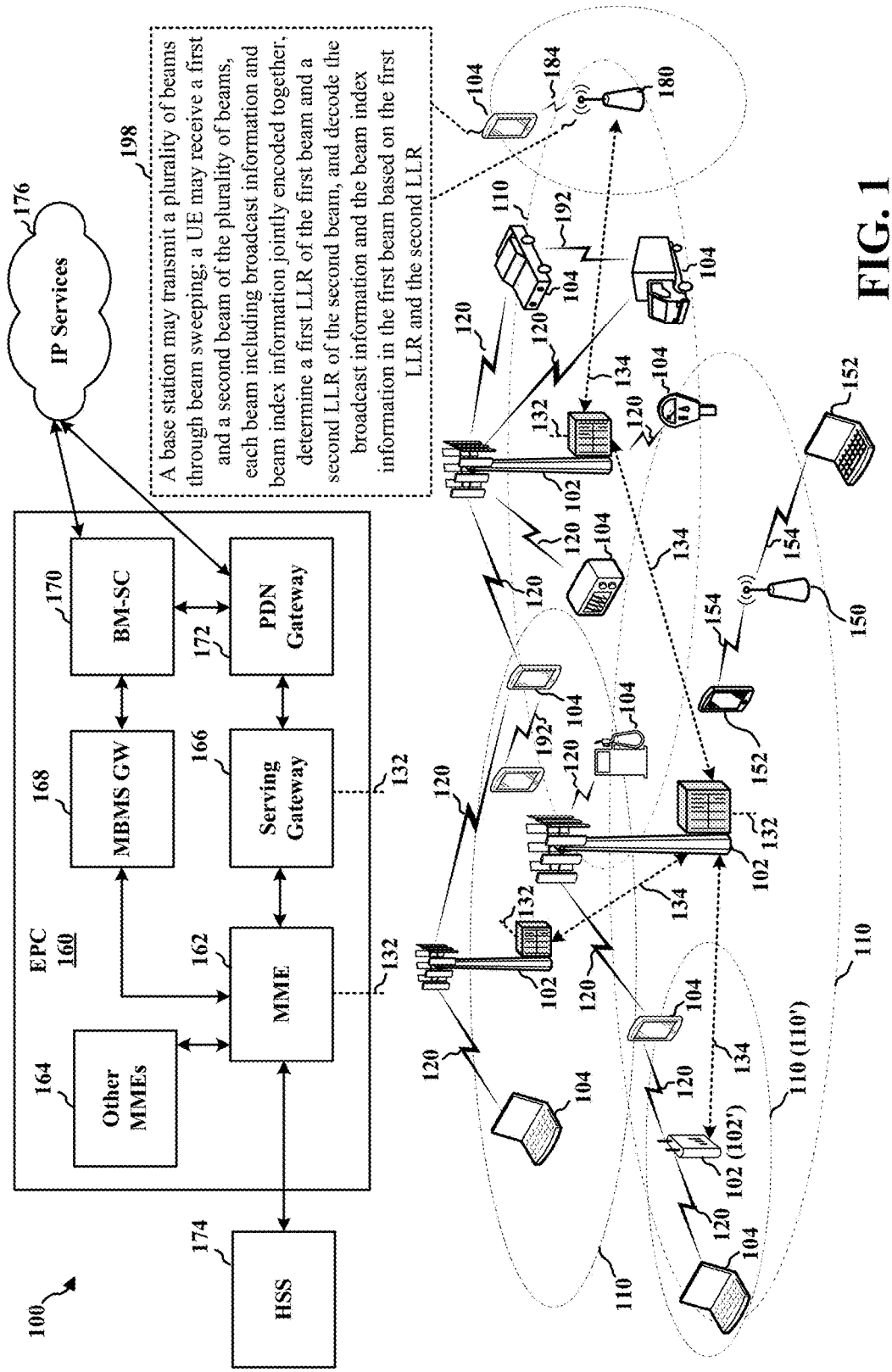
FIG. 1 is a diagram illustrating an example of a wireless communications system and an access network.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

Several aspects of telecommunication systems will now be presented with reference to various apparatus and methods. These apparatus and methods will be described in the following detailed description and illustrated in the accompanying drawings by various blocks, components, circuits, processes, algorithms, etc. (collectively referred to as "elements"). These elements may be implemented using electronic hardware, computer software, or any combination thereof. Whether such elements are implemented as hardware or software depends upon the particular application and design constraints imposed on the overall system.

By way of example, an element, or any portion of an element, or any combination of elements may be implemented as a "processing system" that includes one or more processors. Examples of processors include microprocessors, microcontrollers, graphics processing units (GPUs), central processing units (CPUs), application processors, digital signal processors (DSPs), reduced instruction set computing (RISC) processors, systems on a chip (SoC), baseband processors, field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software shall be construed broadly to mean instructions, instruction sets, code, code segments, program code, programs, subprograms, software components, applications, software applications, software packages, routines, subroutines, objects, executables, threads of execution, procedures, functions, etc., whether referred to as software, firmware, middleware, microcode, hardware description language, or otherwise.

Accordingly, in one or more example embodiments, the functions described may be implemented in hardware, software, or any combination thereof. If implemented in software, the functions may be stored on or encoded as one or more instructions or code on a computer-readable medium. Computer-readable media includes computer storage media. Storage media may be any available media that can be accessed by a computer. By way of example, and not limitation, such computer-readable media can comprise a random-access memory (RAM), a read-only memory (ROM), an electrically erasable programmable ROM (EEPROM), optical disk storage, magnetic disk storage, other magnetic storage devices, combinations of the aforementioned types of computer-readable media, or any other medium that can be used to store computer executable code in the form of instructions or data structures that can be accessed by a computer.

FIG. 1 is a diagram illustrating an example of a wireless communications system and an access network 100. The wireless communications system (also referred to as a wireless wide area network (WWAN)) includes base stations 102, UEs 104, and an Evolved Packet Core (EPC) 160. The base stations 102 may include macro cells (high power cellular base station) and/or small cells (low power cellular base station). The macro cells include base stations. The small cells include femtocells, picocells, and microcells.

The base stations 102 (collectively referred to as Evolved Universal Mobile Telecommunications System (UMTS) Terrestrial Radio Access Network (E-UTRAN)) interface with the EPC 160 through backhaul links 132 (e.g., S1 interface). In addition to other functions, the base stations 102 may perform one or more of the following functions: transfer of user data, radio channel ciphering and deciphering, integrity protection, header compression, mobility control functions (e.g., handover, dual connectivity), inter-cell interference coordination, connection setup and release, load balancing, distribution for non-access stratum (NAS) messages, NAS node selection, synchronization, radio access network (RAN) sharing, multimedia broadcast multicast service (MBMS), subscriber and equipment trace, RAN information management (RIM), paging, positioning, and delivery of warning messages. The base stations 102 may communicate directly or indirectly (e.g., through the EPC 160) with each other over backhaul links 134 (e.g., X2 interface). The backhaul links 134 may be wired or wireless.

The base stations 102 may wirelessly communicate with the UEs 104. Each of the base stations 102 may provide communication coverage for a respective geographic coverage area 110. There may be overlapping geographic coverage areas 110. For example, the small cell 102' may have a coverage area 110' that overlaps the coverage area 110 of one or more macro base stations 102. A network that includes both small cell and macro cells may be known as a heterogeneous network. A heterogeneous network may also include Home Evolved Node Bs (eNBs) (HeNBs), which may provide service to a restricted group known as a closed subscriber group (CSG). The communication links 120 between the base stations 102 and the UEs 104 may include uplink (UL) (also referred to as reverse link) transmissions from a UE 104 to a base station 102 and/or downlink (DL) (also referred to as forward link) transmissions from a base station 102 to a UE 104. The communication links 120 may use multiple-input and multiple-output (MIMO) antenna technology, including spatial multiplexing, beamforming, and/or transmit diversity. The communication links may be through one or more carriers. The base stations 102/UEs 104 may use spectrum up to Y MHz (e.g., 5, 10, 15, 20, 100 MHz) bandwidth per carrier allocated in a carrier aggregation of up to a total of Yx MHz (x component carriers) used for transmission in each direction. The carriers may or may not be adjacent in frequency to each other. Allocation of carriers may be asymmetric with respect to DL and UL (e.g., more or less carriers may be allocated for DL than for UL). The component carriers may include a primary component carrier and one or more secondary component carriers. A primary component carrier may be referred to as a primary cell (PCell) and a secondary component carrier may be referred to as a secondary cell (SCell).

Certain UEs 104 may communicate with each other using device-to-device (D2D) communication link 192. The D2D communication link 192 may use the DL/UL WWAN spectrum. The D2D communication link 192 may use one or more sidelink channels, such as a physical sidelink broadcast channel (PSBCH), a physical sidelink discovery channel (PSDCH), a physical sidelink shared channel (PSSCH), and a physical sidelink control channel (PSCCH). D2D communication may be through a variety of wireless D2D communications systems, such as for example, FlashLinQ, WiMedia, Bluetooth, ZigBee, Wi-Fi based on the IEEE 802.11 standard, LTE, or NR.

The wireless communications system may further include a Wi-Fi access point (AP) 150 in communication with Wi-Fi stations (STAs) 152 via communication links 154 in a 5 GHz unlicensed frequency spectrum. When communicating in an unlicensed frequency spectrum, the STAs 152/AP 150 may perform a clear channel assessment (CCA) prior to communicating in order to determine whether the channel is available.

The small cell 102' may operate in a licensed and/or an unlicensed frequency spectrum. When operating in an unlicensed frequency spectrum, the small cell 102' may employ NR and use the same 5 GHz unlicensed frequency spectrum as used by the Wi-Fi AP 150. The small cell 102', employing NR in an unlicensed frequency spectrum, may boost coverage to and/or increase capacity of the access network.

The gNodeB (gNB) 180 may operate in millimeter wave (mmW) frequencies and/or near mmW frequencies in communication with the UE 104. When the gNB 180 operates in mmW or near mmW frequencies, the gNB 180 may be referred to as an mmW base station. Extremely high frequency (EHF) is part of the RF in the electromagnetic spectrum. EHF has a range of 30 GHz to 300 GHz and a wavelength between 1 millimeter and 10 millimeters. Radio waves in the band may be referred to as a millimeter wave. Near mmW may extend down to a frequency of 3 GHz with a wavelength of 100 millimeters. The super high frequency (SHF) band extends between 3 GHz and 30 GHz, also referred to as centimeter wave. Communications using the mmW/near mmW radio frequency band has extremely high path loss and a short range. The mmW base station 180 may utilize beamforming 184 with the UE 104 to compensate for the extremely high path loss and short range.

The EPC 160 may include a Mobility Management Entity (MME) 162, other MMES 164, a Serving Gateway 166, a Multimedia Broadcast Multicast Service (MBMS) Gateway 168, a Broadcast Multicast Service Center (BM-SC) 170, and a Packet Data Network (PDN) Gateway 172. The MME 162 may be in communication with a Home Subscriber Server (HSS) 174. The MME 162 is the control node that processes the signaling between the UEs 104 and the EPC 160. Generally, the MME 162 provides bearer and connection management. All user Internet protocol (IP) packets are transferred through the Serving Gateway 166, which itself is connected to the PDN Gateway 172. The PDN Gateway 172 provides UE IP address allocation as well as other functions. The PDN Gateway 172 and the BM-SC 170 are connected to the IP Services 176. The IP Services 176 may include the Internet, an intranet, an IP Multimedia Subsystem (IMS), a PS Streaming Service, and/or other IP services. The BM-SC 170 may provide functions for MBMS user service provisioning and delivery. The BM-SC 170 may serve as an entry point for content provider MBMS transmission, may be used to authorize and initiate MBMS Bearer Services within a public land mobile network (PLMN), and may be used to schedule MBMS transmissions. The MBMS Gateway 168 may be used to distribute MBMS traffic to the base stations 102 belonging to a Multicast Broadcast Single Frequency Network (MBSFN) area broadcasting a particular service, and may be responsible for session management (start/stop) and for collecting eMBMS related charging information.

The base station may also be referred to as a gNB, Node B, evolved Node B (eNB), an access point, a base transceiver station, a radio base station, a radio transceiver, a transceiver function, a basic service set (BSS), an extended service set (ESS), or some other suitable terminology. The base station 102 provides an access point to the EPC 160 for a UE 104. Examples of UEs 104 include a cellular phone, a smart phone, a session initiation protocol (SIP) phone, a laptop, a personal digital assistant (PDA), a satellite radio, a global positioning system, a multimedia device, a video device, a digital audio player (e.g., MP3 player), a camera, a game console, a tablet, a smart device, a wearable device, a vehicle, an electric meter, a gas pump, a toaster, or any other similar functioning device. Some of the UEs 104 may be referred to as IoT devices (e.g., parking meter, gas pump, toaster, vehicles, etc.). The UE 104 may also be referred to as a station, a mobile station, a subscriber station, a mobile unit, a subscriber unit, a wireless unit, a remote unit, a mobile device, a wireless device, a wireless communications device, a remote device, a mobile subscriber station, an access terminal, a mobile terminal, a wireless terminal, a remote terminal, a handset, a user agent, a mobile client, a client, or some other suitable terminology.

Referring again to FIG. 1, in certain aspects, a base station, e.g., eNB 180, may be configured to transmit a plurality of beams (e.g., in a time division multiplexing (TDM) manner), each beam including broadcast information and beam index information jointly encoded together, while a mobile device, such as UE 104, may be configured to receive a first beam and a second beam of the plurality of beams from the base station, the first beam including broadcast information and a first beam index information jointly encoded together and the second beam including broadcast information and a second beam index information jointly encoded together (198). The UE 104 may determine a first log likelihood ratio (LLR) of each bit included in a first beam of the received plurality of beams, and determine a second LLR of each bit included in a second beam of the received plurality of beams. The UE 104 may be further configured to decode the broadcast information and the beam index information in the first beam based on both the first LLR and the second LLR (198).

Figure 2:
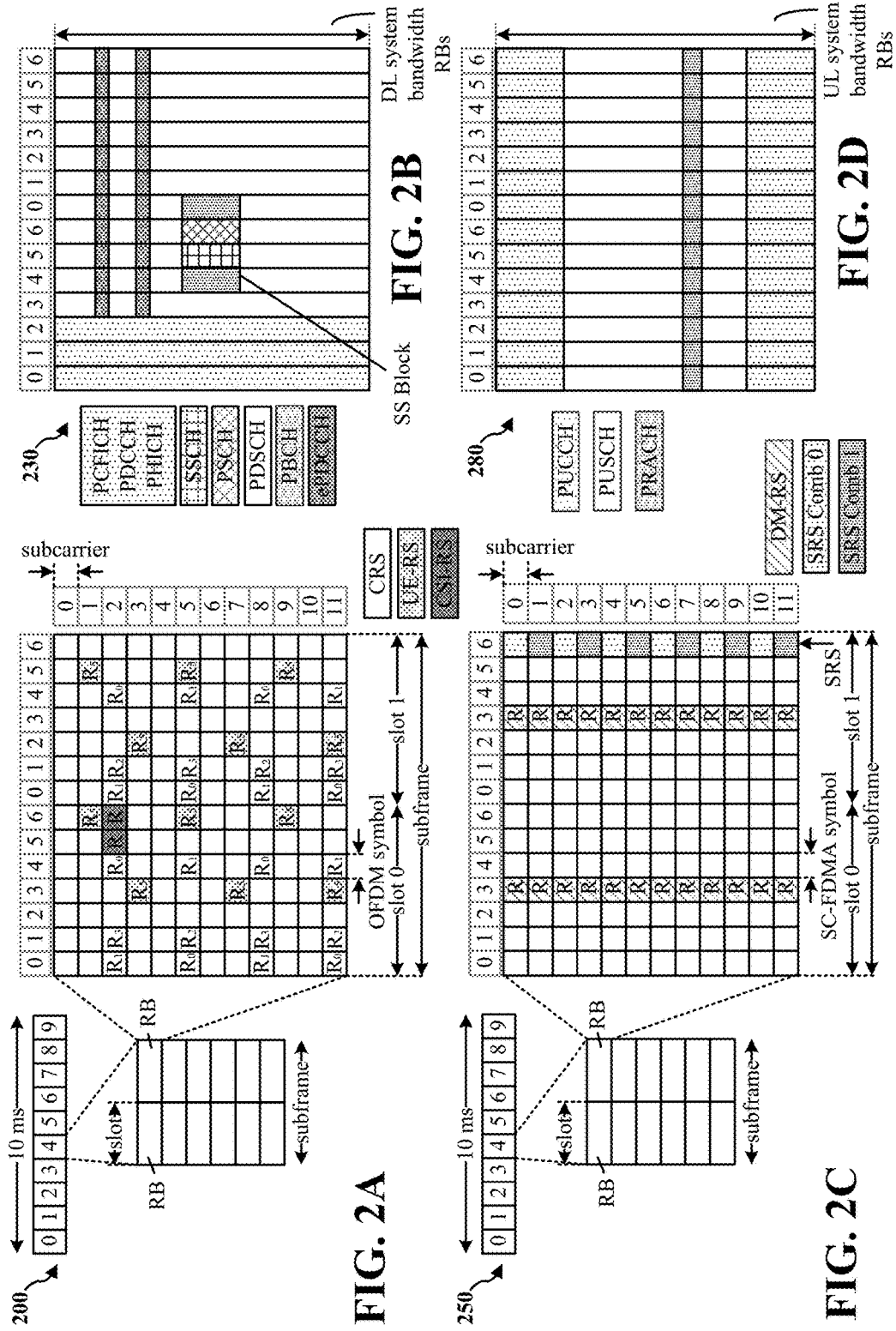
FIGS. 2A, 2B, 2C, and 2D are diagrams illustrating LTE examples of a DL frame structure, DL channels within the DL frame structure, an UL frame structure, and UL channels within the UL frame structure, respectively.

FIG. 2A is a diagram 200 illustrating an example of a DL frame structure. FIG. 2B is a diagram 230 illustrating an example of channels within the DL frame structure. FIG. 2C is a diagram 250 illustrating an example of an UL frame structure. FIG. 2D is a diagram 280 illustrating an example of channels within the UL frame structure. Other wireless communication technologies may have a different frame structure and/or different channels. A frame (10 ms) may be divided into 10 equally sized subframes. Each subframe may include two consecutive time slots. A resource grid may be used to represent the two time slots, each time slot including one or more time concurrent resource blocks (RBs) (also referred to as physical RBs (PRBs)). The resource grid is divided into multiple resource elements (REs). For a normal cyclic prefix, an RB may contain 12 consecutive subcarriers in the frequency domain and 7 consecutive symbols (for DL, OFDM symbols; for UL, SC-FDMA symbols) in the time domain, for a total of 84 REs. For an extended cyclic prefix, an RB may contain 12 consecutive subcarriers in the frequency domain and 6 consecutive symbols in the time domain, for a total of 72 REs. The number of bits carried by each RE depends on the modulation scheme.

As illustrated in FIG. 2A, some of the REs carry DL reference (pilot) signals (DL-RS) for channel estimation at the UE. The DL-RS may include cell-specific reference signals (CRS) (also sometimes called common RS), UE-specific reference signals (UE-RS), and channel state information reference signals (CSI-RS). FIG. 2A illustrates CRS for antenna ports 0, 1, 2, and 3 (indicated as $R_0$, $R_1$, $R_2$, and $R_3$, respectively), UE-RS for antenna port 5 (indicated as $R_5$), and CSI-RS for antenna port 15 (indicated as R).

FIG. 2B illustrates an example of various channels within a DL subframe of a frame. The physical control format indicator channel (PCFICH) is within symbol 0 of slot 0, and carries a control format indicator (CFI) that indicates whether the physical downlink control channel (PDCCH) occupies 1, 2, or 3 symbols (FIG. 2B illustrates a PDCCH that occupies 3 symbols). The PDCCH carries downlink control information (DCI) within one or more control channel elements (CCEs), each CCE including nine RE groups (REGs), each REG including four consecutive REs in an OFDM symbol. A UE may be configured with a UE-specific enhanced PDCCH (ePDCCH) that also carries DCI. The ePDCCH may have 2, 4, or 8 RB pairs (FIG. 2B shows two RB pairs, each subset including one RB pair). The physical hybrid automatic repeat request (ARQ) (HARQ) indicator channel (PHICH) is also within symbol 0 of slot 0 and carries the HARQ indicator (HI) that indicates HARQ acknowledgement (ACK)/negative ACK (NACK) feedback based on the physical uplink shared channel (PUSCH). The primary synchronization channel (PSCH) may be within symbol 6 of slot 0 within subframes 0 and 5 of a frame. The PSCH carries a primary synchronization signal (PSS) that is used by a UE 104 to determine subframe/symbol timing and a physical layer identity. The secondary synchronization channel (SSCH) may be within symbol 5 of slot 0 within subframes 0 and 5 of a frame. The SSCH carries a secondary synchronization signal (SSS) that is used by a UE to determine a physical layer cell identity group number and radio frame timing. Based on the physical layer identity and the physical layer cell identity group number, the UE can determine a physical cell identifier (PCI). Based on the PCI, the UE can determine the locations of the aforementioned DL-RS. The physical broadcast channel (PBCH), which carries a master information block (MIB), may be logically grouped with the PSCH and SSCH to form a synchronization signal (SS) block. The MIB provides a number of RBs in the DL system bandwidth, a PHICH configuration, and a system frame number (SFN). The physical downlink shared channel (PDSCH) carries user data, broadcast system information not transmitted through the PBCH such as system information blocks (SIBs), and paging messages.

As illustrated in FIG. 2C, some of the REs carry demodulation reference signals (DM-RS) for channel estimation at the base station. The UE may additionally transmit sounding reference signals (SRS) in the last symbol of a subframe. The SRS may have a comb structure, and a UE may transmit SRS on one of the combs. The SRS may be used by a base station for channel quality estimation to enable frequency-dependent scheduling on the UL.

FIG. 2D illustrates an example of various channels within an UL subframe of a frame. A physical random access channel (PRACH) may be within one or more subframes within a frame based on the PRACH configuration. The PRACH may include six consecutive RB pairs within a subframe. The PRACH allows the UE to perform initial system access and achieve UL synchronization. A physical uplink control channel (PUCCH) may be located on edges of the UL system bandwidth. The PUCCH carries uplink control information (UCI), such as scheduling requests, a channel quality indicator (CQI), a precoding matrix indicator (PMI), a rank indicator (RI), and HARQ ACK/NACK feedback. The PUSCH carries data, and may additionally be used to carry a buffer status report (BSR), a power headroom report (PHR), and/or UCI.

Figure 3:
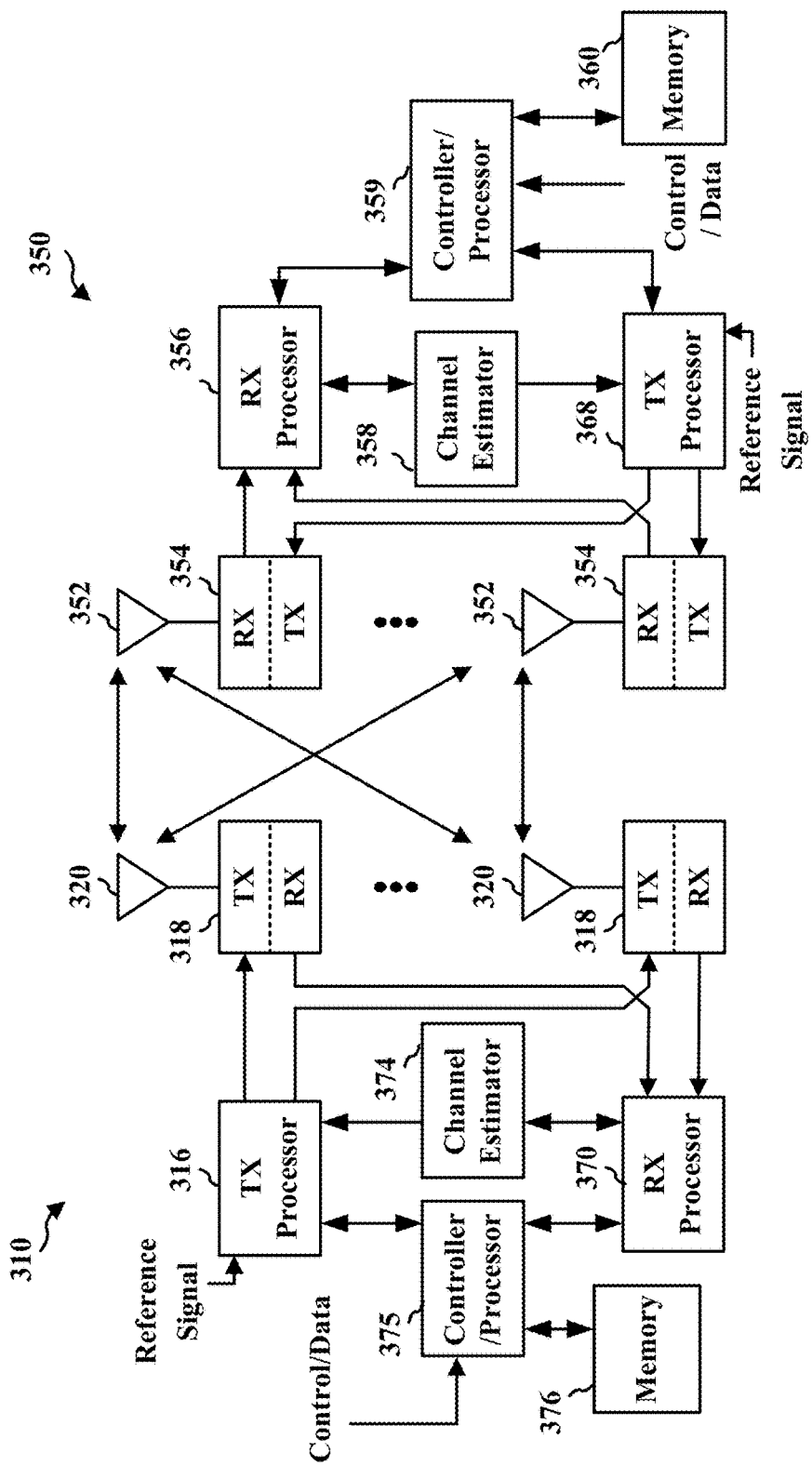
FIG. 3 is a diagram illustrating an example of an evolved Node B (eNB) and user equipment (UE) in an access network.

FIG. 3 is a block diagram of a base station 310 in communication with a UE 350 in an access network. In the DL, IP packets from the EPC 160 may be provided to a controller/processor 375. The controller/processor 375 implements layer 3 and layer 2 functionality. Layer 3 includes a radio resource control (RRC) layer, and layer 2 includes a packet data convergence protocol (PDCP) layer, a radio link control (RLC) layer, and a medium access control (MAC) layer. The controller/processor 375 provides RRC layer functionality associated with broadcasting of system information (e.g., MIB, SIBs), RRC connection control (e.g., RRC connection paging, RRC connection establishment, RRC connection modification, and RRC connection release), inter radio access technology (RAT) mobility, and measurement configuration for UE measurement reporting; PDCP layer functionality associated with header compression/decompression, security (ciphering, deciphering, integrity protection, integrity verification), and handover support functions; RLC layer functionality associated with the transfer of upper layer packet data units (PDUs), error correction through ARQ, concatenation, segmentation, and reassembly of RLC service data units (SDUs), re-segmentation of RLC data PDUs, and reordering of RLC data PDUs; and MAC layer functionality associated with mapping between logical channels and transport channels, multiplexing of MAC SDUs onto transport blocks (TBs), demultiplexing of MAC SDUs from TBs, scheduling information reporting, error correction through HARQ, priority handling, and logical channel prioritization.

The transmit (TX) processor 316 and the receive (RX) processor 370 implement layer 1 functionality associated with various signal processing functions. Layer 1, which includes a physical (PHY) layer, may include error detection on the transport channels, forward error correction (FEC) coding/decoding of the transport channels, interleaving, rate matching, mapping onto physical channels, modulation/demodulation of physical channels, and MIMO antenna processing. The TX processor 316 handles mapping to signal constellations based on various modulation schemes (e.g., binary phase-shift keying (BPSK), quadrature phase-shift keying (QPSK), M-phase-shift keying (M-PSK), M-quadrature amplitude modulation (M-QAM)). The coded and modulated symbols may then be split into parallel streams. Each stream may then be mapped to an OFDM subcarrier, multiplexed with a reference signal (e.g., pilot) in the time and/or frequency domain, and then combined together using an Inverse Fast Fourier Transform (IFFT) to produce a physical channel carrying a time domain OFDM symbol stream. The OFDM stream is spatially precoded to produce multiple spatial streams. Channel estimates from a channel estimator 374 may be used to determine the coding and modulation scheme, as well as for spatial processing. The channel estimate may be derived from a reference signal and/or channel condition feedback transmitted by the UE 350. Each spatial stream may then be provided to a different antenna 320 via a separate transmitter 318TX. Each transmitter 318TX may modulate an RF carrier with a respective spatial stream for transmission.

At the UE 350, each receiver 354RX receives a signal through its respective antenna 352. Each receiver 354RX recovers information modulated onto an RF carrier and provides the information to the receive (RX) processor 356. The TX processor 368 and the RX processor 356 implement layer 1 functionality associated with various signal processing functions. The RX processor 356 may perform spatial processing on the information to recover any spatial streams destined for the UE 350. If multiple spatial streams are destined for the UE 350, they may be combined by the RX processor 356 into a single OFDM symbol stream. The RX processor 356 then converts the OFDM symbol stream from the time-domain to the frequency domain using a Fast Fourier Transform (FFT). The frequency domain signal comprises a separate OFDM symbol stream for each subcarrier of the OFDM signal. The symbols on each subcarrier, and the reference signal, are recovered and demodulated by determining the most likely signal constellation points transmitted by the base station 310. These soft decisions may be based on channel estimates computed by the channel estimator 358. The soft decisions are then decoded and deinterleaved to recover the data and control signals that were originally transmitted by the base station 310 on the physical channel. The data and control signals are then provided to the controller/processor 359, which implements layer 3 and layer 2 functionality.

The controller/processor 359 can be associated with a memory 360 that stores program codes and data. The memory 360 may be referred to as a computer-readable medium. In the UL, the controller/processor 359 provides demultiplexing between transport and logical channels, packet reassembly, deciphering, header decompression, and control signal processing to recover IP packets from the EPC 160. The controller/processor 359 is also responsible for error detection using an ACK and/or NACK protocol to support HARQ operations.

Similar to the functionality described in connection with the DL transmission by the base station 310, the controller/processor 359 provides RRC layer functionality associated with system information (e.g., MIB, SIBs) acquisition, RRC connections, and measurement reporting; PDCP layer functionality associated with header compression/decompression, and security (ciphering, deciphering, integrity protection, integrity verification); RLC layer functionality associated with the transfer of upper layer PDUs, error correction through ARQ, concatenation, segmentation, and reassembly of RLC SDUs, re-segmentation of RLC data PDUs, and reordering of RLC data PDUs; and MAC layer functionality associated with mapping between logical channels and transport channels, multiplexing of MAC SDUs onto TBs, demultiplexing of MAC SDUs from TBs, scheduling information reporting, error correction through HARQ, priority handling, and logical channel prioritization.

Channel estimates derived by a channel estimator 358 from a reference signal or feedback transmitted by the base station 310 may be used by the TX processor 368 to select the appropriate coding and modulation schemes, and to facilitate spatial processing. The spatial streams generated by the TX processor 368 may be provided to different antenna 352 via separate transmitters 354TX. Each transmitter 354TX may modulate an RF carrier with a respective spatial stream for transmission.

The UL transmission is processed at the base station 310 in a manner similar to that described in connection with the receiver function at the UE 350. Each receiver 318RX receives a signal through its respective antenna 320. Each receiver 318RX recovers information modulated onto an RF carrier and provides the information to a RX processor 370.

The controller/processor 375 can be associated with a memory 376 that stores program codes and data. The memory 376 may be referred to as a computer-readable medium. In the UL, the controller/processor 375 provides demultiplexing between transport and logical channels, packet reassembly, deciphering, header decompression, control signal processing to recover IP packets from the UE 350. IP packets from the controller/processor 375 may be provided to the EPC 160. The controller/processor 375 is also responsible for error detection using an ACK and/or NACK protocol to support HARQ operations.

Cellular systems typically employ periodic or frequent transmission of broadcast information, such as the PBCH in LTE. Via the PBCH the base station broadcasts a number of parameters needed for initial access of the cell such as, for example, downlink system bandwidth, the Physical Hybrid ARQ Indicator Channel structure, and the most significant bits of the System Frame Number. The parameters may be carried in a MIB.

In a mmW system, a gNB (e.g., a 5G base station/eNB) may send broadcast information (e.g., PBCH with MIB) through beam-sweeping, e.g., with beams conveying broadcast information being transmitted in a TDM fashion in some configurations. In some configurations each beam may also convey beam/symbol index information, so that each receiving device such as a UE, upon the reception of a beam, may derive slot boundary or even frame boundary using the received information, in addition to the decoded broadcast information.

In accordance with an aspect, to ensure robust reception of the broadcast information, the broadcast beam-sweeping scheme is designed to allow soft-combining across the beams. By doing so, a higher level of reliability of the decoded information can be realized at the receiving device. Accordingly, in accordance with an aspect, the broadcast information may be coded together with beam/symbol index information and transmitted together through beam sweeping, e.g., in a TDM fashion via directional beams.

In accordance with the features of some configurations, a receiving device may receive a plurality of beams and may be able to combine the log-likelihood ratios (LLRs) from adjacent beams before decoding the communicated information to achieve higher reliability. The LLR is a reliability metric used in communication systems and may be determined, e.g., by a receiving UE, for each received bit stream on a per bit basis. For a given bit of a bit stream in a received beam, a strongly positive value of an LLR implies that the bit is most likely 0 whereas a negative value implies that the bit is most likely 1. While in many existing systems, soft combining may not be performed for LLRs corresponding to different beams that communicate different information, various features described herein facilitate soft combining of LLRs corresponding to adjacent beams even though the beam index communicated in the different beams is different. The ability to combine LLRs corresponding to adjacent beams communicating different information (due to different beam indices) allows for a receiving device to more reliably decode the received information and reduce decoding errors.

Figure 4:
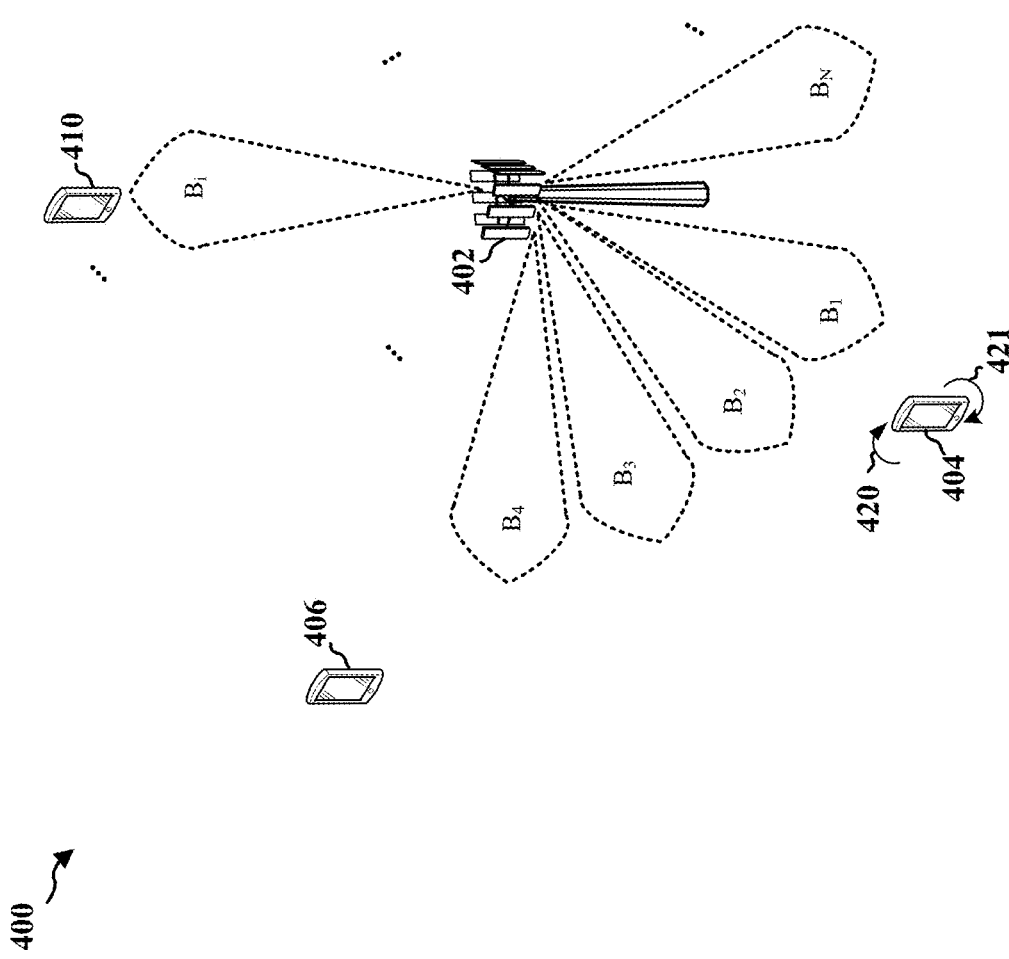
FIG. 4 illustrates an exemplary communications system and beam sweeping used in the communication system in accordance with an exemplary configuration.

FIG. 4 illustrates an exemplary communication system 400 implemented in accordance with an exemplary configuration. The communication system 400 may be implemented as a mmW system in some configurations. The exemplary communications system 400 may be a part of the system and access network of FIG. 1. The communications system 400 includes a base station (e.g., gNB) 402 and a plurality of UEs including UE 404, UE 406, . . . , and UE 410. The base station 402 may be the base station 180 and each of the UEs 404, 406, . . . , 410 may be implemented as UE 104 of FIG. 1. In one configuration, the base station 402 may transmit a beamformed signal in one or more of the directions and the UE 404 may receive the beamformed signal from the base station 402 in one or more receive directions. The base station 402/UE 404 may perform beam training to determine the best receive and transmit directions for each of the base station 402/UE 404.

In accordance with one aspect, the base station 402 may perform a beam sweep to transmit a plurality of beams $B_1$, $B_2$, $B_3$ . . . , $B_N$ in various directions, e.g., in a TDM manner. In aspect, each of the beams may include broadcast information and beam/symbol index information jointly encoded together. While the broadcast information (e.g., PBCH information and/or other broadcast control information) remains the same in each of the beams, the beam index information is different. In the illustrated configuration of FIG. 4, the base station 402 may be configured to transmit N beams. With reference to FIG. 4, consider an example where there are N beams transmitted from the base station 402, and the base station 402 uses $\log_2(N)$ information bits, which are concatenated with the broadcast information, to convey the beam index. For example, a first beam, e.g., $B_1$, may communicate a first bit stream in which a set of information bits correspond to the broadcast information and another set of information bits of the first bit stream correspond to the beam index of the first beam $B_1$. Similarly, a second beam, e.g., $B_2$, may communicate a second bit stream in which a set of information bits correspond to the broadcast information and another set of information bits of the second bit stream correspond to the beam index of the second beam. As illustrated, the first and second beams may be adjacent to one another.

Consider an example with reference to FIG. 4 where the UE 404 of the communication system 400 receives a plurality of beams, e.g., two beams $B_1$ and $B_2$, from the base station 402. As discussed earlier, each of the beams may include broadcast information and a corresponding beam index jointly encoded together. Thus, the first beam $B_1$ received by UE 404 may include broadcast information and a first beam index information jointly encoded together, and the second beam may include broadcast information and a second beam index information jointly encoded together.

For the purposes of discussion of the example, consider that "A" denotes the information bits in a first beam $B_1$, "B" denotes the information bits in a second beam $B_2$, Code (A) denotes the coded bits in beam $B_1$ and Code (B) denotes the coded bits in beam $B_2$. It should be noted that Code (A) includes bits corresponding to both the broadcast information and the beam index information of the first beam $B_1$ while Code (B) includes bits corresponding to both the broadcast information and the beam index information of the second beam $B_2$. Code (A) may be obtained inputting A (information bits in a first beam) to an encoder of a given code rate and Code (B) may be obtained in the same manner. In various configurations "A" and "B" are coded using linear codes. Thus, Code (A) and Code (B) satisfy linear code properties.

In accordance with some configurations, the receiving UE, e.g., UE 404, may determine (420) the LLRs of the received beams $B_1$ and $B_2$, which are adjacent beams, and combine the LLRs from the adjacent beams before decoding the received data in a beam, e.g., beam $B_1$, in order to achieve greater decoding reliability. Normally in order for the LLRs from adjacent beams to be combined, the information communicated by the adjacent beams should be the same. However, since information bits in the first beam $B_1$ and the second beam $B_2$ are not the same, e.g., because of the difference in beam index (i.e., A≠B and Code (A)≠Code (B) because of the beam index difference), simply combining the two LLRs may not be possible by using earlier existing techniques. However, in an aspect if A and B are not known individually, but A⊕B is known or may be determined (where the symbol ⊕ represents an exclusive OR), then soft combining may still be performed in accordance with various features described herein. In accordance with one aspect of some configurations, first the following linear code property is used to find the locations of coded bits in which Code (A) and Code (B) are different:

$$\text{Code}(A) \oplus \text{Code}(B) = \text{Code}(A \oplus B) \quad (1),$$

where Code (A⊕B) is a joint encoding of an exclusive OR of the broadcast information and the first beam index information of the first beam $B_1$ with the broadcast information and the second beam index information of the second beam $B_2$, then in accordance with an aspect of some configurations, the LLR of A (information bits in the first beam $B_1$) and LLR of B (information bits in the second beam $B_2$) is combined for the decoding of "A" using the following equation:

$$\text{LLR}(A) + \text{LLR}(B) \times (1 - 2(\text{Code}(A \oplus B))) \quad (2).$$

Thus, it can be observed that with the above equation (2), the LLRs are added (e.g., LLR(A)+LLR(B)) at locations where the coded bits in Code (A) and Code (B) are the same since in such a case Code (A⊕B)=0, while the LLRs are subtracted (e.g., LLR(A)-LLR(B)) where the coded bits in Code (A) and Code (B) are different since in such a case Code (A⊕B)=1. Thus, the LLRs in LLR (B), e.g., determined LLRs corresponding to the information bits communicated in the second beam $B_2$, may be flipped in the location where Code (A⊕B) is one. In accordance with an aspect of some embodiments, the LLRs of the two beams combined in accordance with equation (2), as discussed above, are then used by UE 404 to decode (421) the data (e.g., information bits A and/or B) communicated in beam $B_1$ and/or beam $B_2$. Since the two beams communicate the same broadcast information, it may be sufficient to decode one beam.

However, in the above case, from the perspective of the UE, "A", "B" as well as (A⊕B) is unknown. Because a receiving device, e.g., UE 404 or another UE receiving multiple beams, does not know the beam index before the decoding and thus does not know which beam(s) (out of N beams) have been received and are to be decoded, the UE may need to perform blind hypothesis on the beam index, before the soft-combining can be done to combine the LLRs corresponding to A and B in manner discussed above.

Figure 5:
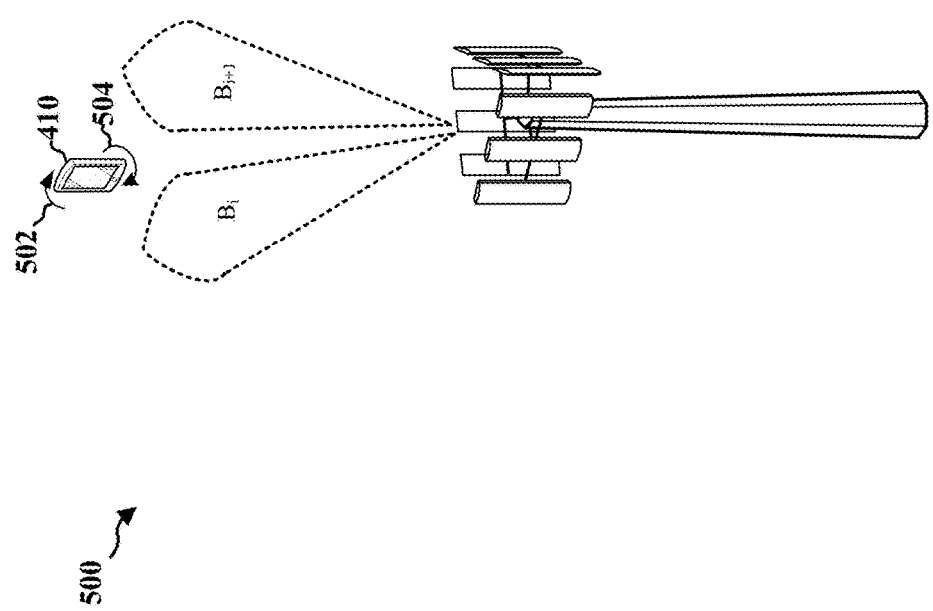
FIG. 5 is a drawing illustrating a portion of the communication system of FIG. 4 where a UE may receive and process two adjacent beams in accordance with various configurations.

Consider the following example with reference to FIG. 5 for a better understanding of the concept. FIG. 5 illustrates a portion of the communication system 400 showing an example where the UE 410 receives beams $B_i$ and $B_{i+1}$, from the base station 402, and performs soft combining and decoding in accordance with the methods described herein. The received beams $B_i$ and $B_{i+1}$ are two adjacent beams. For example, the adjacent beams $B_1$ and $B_{i+1}$ may be transmitted by the base station 402 in a TDM manner and received by the UE sequentially one after the other. The adjacent beams may or may not be directionally or spatially adjacent to each other. Each of the beams received by the UE 410 includes broadcast information and a beam index of the corresponding beam jointly encoded together. Let $S^i$ denote the bit stream in beam $B_i$. One scheme may include performing blind decoding/hypothesis on each beam index, for example, by assuming a beam index for a given received beam. Thus, in such a scheme, assuming that two adjacent beams are to be soft-combined prior to decoding information communicated in one beam, for i=0, the UE 410 may (combine (502) the LLRs corresponding to the bits in beam 0 ($B_0$) and the LLRs corresponding to the bits in beam $B_1$ (e.g., the next adjacent beam to beam 0 that is to be decoded) according to $S^0 \oplus S^1$ and then perform decoding (504). Assuming i=1, beam 1 ($B_1$) and beam 2 ($B_2$) are combined according to $S^1 \oplus S^2$ and then decoding is performed. Assuming i=2, combine beam 2 ($B_2$) and beam 3 ($B_3$) according to $S^2 \oplus S^3$ and then decode, and continue in the similar manner. Thus, in each case the LLRs of the given set of beams are combined in accordance with equation (2) and then used to decode the data communicated in the given set of beams. Since the decoding is performed based on a blind hypothesis of the beam index, the decoding may be referred to as blind decoding. In some configurations, a cyclic redundancy check (CRC) may be performed following each blind decoding in order to determine whether a blind decoding is successful and correct. However, in the above scheme it can be seen that the number of blind decodings is large, that is the number of blind decodings equals the number of beams, even for combining two beams. Thus, while such a scheme may be useful for soft combining and decoding, but a large number of blind decodings are needed even to combine 2 beams.

In accordance with another exemplary scheme used in various configurations, to combine two adjacent beams, the UE 410 may only need to perform hypothesis testing on different possible exclusive ORs (XORs) of adjacent beam transmissions. Let $XORSet^2$ represent a set of different possible XORs of information bits in the two adjacent beams, e.g., beams $B_i$ and $B_{i+1}$, which may be needed to combine two beams (where there may be a total of N beams), then in accordance with this scheme: $XORSet^2 = \{S^0 \oplus S^1, S^1 \oplus S^2, S^2 \oplus S^3, S^3 \oplus S^4, \ldots, S^{(N-2)} \oplus S^{(N-1)}\}$ It can be easily understood that by using natural-order beam index binary representation $|XORSet^2|=\log_2 (N)$, which is the number of blind decodings/hypotheses needed in the case where two adjacent beams are to be combined. Each of the XORs in the XORSet is an individual hypothesis, e.g., of the beam index information. Decoding may be performed, in some configurations, for each unique hypothesis of the total number of hypotheses in the $XORSet^2$. Using the natural-order beam index binary representation implies that the beam index corresponding to a plurality of beams follows natural binary order. For example, if the total number of beams (N) is 4 then only 2 bits are need to convey the beam index, and the beam index binary representation natural order will be 00, 01, 10, 11. In this example, since N (total number of beams) equals 4 and combining two adjacent beams is desired, only 2 blind decodings need to be performed since $\log_2 (4)=2$. This is so because only 2 individual hypothesis in the XORSet (out of 4) are unique and different from each other. Similarly, if N=8 and combining two adjacent beams is desired, only 3 blind decodings may need to be performed since $\log_2 (8)=3$. This is so because only 3 individual hypothesis in the XORSet (out of 8) are unique and different from each other.

Continuing with the same scheme, if combining three adjacent beams is to be performed, then the UE 410 may need to perform hypothesis testing on potential values of ($S^i \oplus S^{i+1}$, $S^i \oplus S^{i+2}$). In this case an $XORSet^3$ may be defined as:

$XORSet^3 = \{(S^0 \oplus S^1, S^0 \oplus S^1), \ldots, (S^{(N-3)} \oplus S^{(N-2)}, S^{(N-3)} \oplus S^{(N-1)})\}$ Again, it can be shown that by using natural-order beam index binary representation $|XORSet^3|=2(\log_2 (N)-1)$, which is the number of blind decoding needed in the case where three adjacent beams are to be combined. Similarly, if combining four adjacent beams is to be performed, then $|XORSet^4|=4(\log_2 (N)-2)$ blind hypotheses/decodings may need be performed. As can be appreciated, the second scheme significantly reduces the number of required blind decodings in comparison to the first scheme where blind decoding/hypothesis for each beam index was performed requiring N blind hypotheses for soft-combining of just two beams.

Thus, in the above discussed manner the information communicated in a beam (e.g., broadcast information and the beam index information) may be decoded by performing blind decodings.

As discussed above, the LLRs of a given set of beams being combined are first determined and combined based on equation (2) and then decoding is performed. In order to determine whether a blind decoding resulted in a successful decoding of the broadcast information and the beam index information communicated in beam for which the blind decoding is performed, the UE 410 may perform a CRC check using a check value data communicated in the beam. If the performed CRC check for matching the check value is successful, the blind decoding is considered successful, otherwise the blind decoding is considered unsuccessful and the next blind decoding may be performed. It should be appreciated that performing a check such as a CRC is provided only as an example to facilitate an understanding and is not limiting in any way and many other different checks may be used instead.

Various aspects related to the exemplary methods which may be used in the communication system 400 are discussed below.

Figure 6:
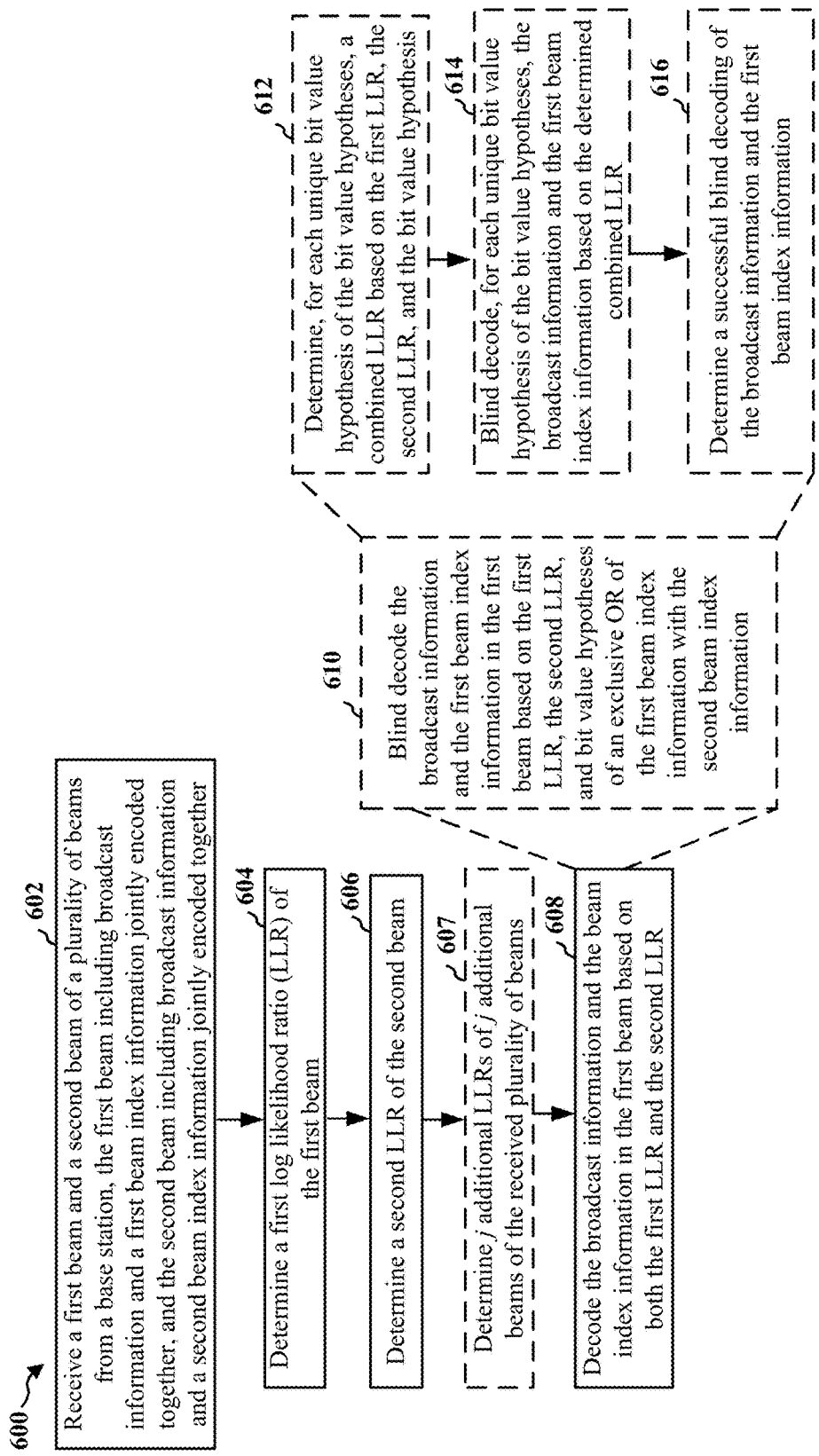
FIG. 6 is a flowchart of a method of wireless communication of a UE.

FIG. 6 is a flowchart 600 of a method of wireless communication. The method may be performed by an apparatus (e.g., the UE 104, 404/410 or another UE of communication system 400, apparatus 702/702'). Blocks shown as dashed boxes are optional and may or may not be performed in certain embodiments. Reference to FIGS. 4-5 may be made to facilitate the discussion of flowchart 600. At 602, the apparatus (e.g., UE 404) may receive a first beam and a second beam of a plurality of beams from a base station, e.g., base station 402. The first beam may include broadcast information and a first beam index information jointly encoded together, and the second beam may include broadcast information and a second beam index information jointly encoded together. For example, referring to FIG. 4, the first and second beams may be the beams $B_1$ and $B_2$ that are transmitted by the base station 402 as part of a beam sweep where the base station 402 transmits multiple beams (e.g., N beams) in a TDM manner. In some, but not necessarily all configurations, the first beam and the second beam are received through a beam sweep. For example, the UE 404 may perform a beam sweep to receive the first and second beams. In some other configurations, the UE 404 may receive the first and second beams (and additional beams of the plurality of beams) without performing a beam sweep.

At 604 the apparatus may determine a first LLR of the first beam, e.g., with the first LLR being determined on a per bit basis corresponding to the information bits in the first beam. At 606 the apparatus may determine a second LLR of the second beam, e.g., with the second LLR including determined LLRs corresponding to the communicated bits in the second beam. In some configurations, in addition to the first and second beams, the apparatus may further receive a third beam of the plurality of beams from the base station. The third beam may be adjacent to one of the first beam $B_1$ or the second beam $B_2$. For example, in some configurations, the beams received by the apparatus include j additional beams. In some such configurations, at 607 the apparatus may determine j additional LLRs of the j additional beams of the received plurality of beams in a similar manner as discussed above.

At 608 the apparatus may perform decoding of the broadcast information and the first beam index information in the first beam based on both the first LLR and the second LLR, e.g., in the manner discussed with respect to FIGS. 4-5. In some configurations the broadcast information and the first beam index information in the first beam is decoded based on an LLR that is a function of the first LLR and the second LLR. For example, the decoding may be performed based on an LLR generated based on a specific combination of the first LLR and second LLR such as discussed with regard to FIG. 4, e.g., in accordance with equation (2). In some configurations the broadcast information and the first beam index information in the first beam is decoded based on a combined LLR equal to $LLR_{B1}+LLR_{B2}(1-2(Code(B_1 \oplus B_2)))$, where $LLR_{B1}$ is the first LLR, $LLR_{B2}$ is the second LLR, and $Code(B_1 \oplus B_2)$ is a joint encoding of an exclusive OR of the broadcast information and the first beam index information of the first beam ($B_1$) with the broadcast information and the second beam index information of the second beam ($B_2$). As discussed earlier, since $B_1 \oplus B_2$ is not known, the apparatus may perform blind hypotheses of the $B_1 \oplus B_2$ by hypothesizing/assuming a value for the beam index.

In some configurations decoding the broadcast information and the first beam index information in the first beam at 608 comprises one or more operations as discussed with regard to 610, 612, 614, and 616. Thus, in some configurations, decoding the broadcast information and the first beam index information in the first beam includes blind decoding the broadcast information and the first beam index information in the first beam based on the first LLR, the second LLR, and bit value hypotheses (also referred to as blind hypotheses or simply hypotheses) of an exclusive OR of the first beam index information with the second beam index information, as illustrated at 610. As discussed above in detail with regard to FIG. 5, the UE may need to determine hypotheses of the beam index information in order to perform the soft combining prior to decoding. For example as discussed supra, for combining two adjacent beams, the apparatus may only need to perform hypothesis testing on different possible exclusive ORs (XORs) of adjacent beam transmissions. The XORSets discussed above represent the bit value hypotheses in various cases depending on how many adjacent beams are desired to be combined. In some configurations each individual bit value hypothesis in the bit value hypotheses is an XOR of the bit streams in adjacent beams. It should be appreciated that a reference to beam combining and/or soft combining as used herein refers to the combining of the LLRs (on a bit by bit basis) of the information bits in the adjacent beams being combined. As discussed, the LLRs of a first and second beam may be combined based on hypothesis of the broadcast information and the beam index information of the first beam with the broadcast information and the second beam index information of the second beam. In some configurations the combining of the LLRs is based on the hypothesis of an exclusive OR of the first beam index information with the second beam index information.

In some configurations as part of the decoding operation, at 612 the apparatus determines, for each unique bit value hypothesis of the bit value hypotheses, a combined LLR based on the first LLR, the second LLR, and the unique bit value hypothesis. In some configurations, a number of bit value hypothesis in the bit value hypotheses is X, and a number of the unique bit value hypothesis is M, where M<X The total number of bit value hypothesis X in the bit value hypotheses may be equal to the total number of beams N. In some configurations M is equal to $\log_2(X)$.

For discussion purposes consider an example where two adjacent beams, e.g., beams $B_i$ and $B_{i+1}$, are being combined (that is LLRs corresponding to beams $B_i$ and $B_{i+1}$ are being combined) for decoding and the total number of beams is 4 but the beam index of the received beams is not known. If $S^i$ represents the bit stream in beam $B_i$, then in accordance with an aspect the XORSet$^2$ will include $\log_2(4)$ unique hypotheses that need to be performed to combine the LLRs of the two beams $B_i$ and $B_{i+1}$. In such an example, the apparatus may start by assuming that i=0 and since the total number of beams equals 4, only two bits are needed to represent the beam index for each beam. For example with natural-order beam index binary representation let the first beam index for beam $B_0$ be 00, second beam index for beam $B_1$ be 01, third beam index for beam $B_2$ may be 10, and the fourth beam index for beam $B_3$ be 11. Now if an XOR of the bit streams $S^0$, $S^1$, $S^2$, $S^3$ corresponding to beams $B_0$, $B_1$, $B_2$, $B_3$ is determined ($S^0 \oplus S^1$=01, $S^1 \oplus S^2$=11, $S^2 \oplus S^3$=01, $S^3 \oplus S^1$=11, with the XOR of bits corresponding to broadcast information being ignored in the example for the sake of simplicity and because the broadcast information bits in the two streams are the same and the XOR of these corresponding bits is 0), it can be observed that there are only 2 unique XORs and thus by using these two XORs as individual unique hypothesis of bit streams in beams $B_i$ and $B_{i+1}$, only two blind decodings are performed. Similarly, it can be shown that for N=8 beams, for combining two adjacent beams there are only 3 unique hypothesis which can be used to combine the LLRs of the adjacent beams and then perform 3 blind decodings based on the 3 hypothesis.

In some configurations as part of the decoding operation, subsequent to the combined LLR, at 614 the apparatus performs blind decoding, for each unique bit value hypothesis of the bit value hypotheses, the broadcast information and the first beam index information based on the determined combined LLR. Depending on the number of beams desired to be combined, a number of blind decodings may be performed, with each blind decoding (of the broadcast information and the first beam index information) being based on a corresponding unique hypothesis of the XOR of the broadcast information and the first beam index information of the first beam with the broadcast information and the second beam index information of the second beam, e.g., since each unique hypothesis is used in determining a combined LLR based on the first LLR and the second LLR. In some configurations, after having performed a blind decoding, e.g., based on a unique hypothesis, the apparatus at 616 determines a successful blind decoding of the broadcast information and the first beam index information, e.g., based on a CRC check or another check technique. For example, if a first blind decoding is determined to be successful, no additional blind decodings (e.g., for remaining unique hypothesis) may be performed and the decoded broadcast information and the first beam index thus obtained is considered accurate. If the blind decoding is determined to be unsuccessful, next blind decoding (e.g., based on the next unique hypothesis) is performed and so on until a successful blind decoding is determined.

While in the flowchart, the discussion focuses on decoding the broadcast information and the beam index information in the first beam based on the first LLR and the second LLR, it should be appreciated that the decoding may be performed on additional LLRs corresponding to additional beams in some embodiments. For example as discussed at 607, the apparatus may obtain j additional LLRs. In some configurations the broadcast information and the first beam index information in the first beam may be decoded further based on the j additional LLRs.

While various aspects of an exemplary method are discussed with regard to flowchart 600, other variations are possible. Additionally, some of the features discussed above may be desirable in some configurations but may not necessarily be needed.

Figure 7:
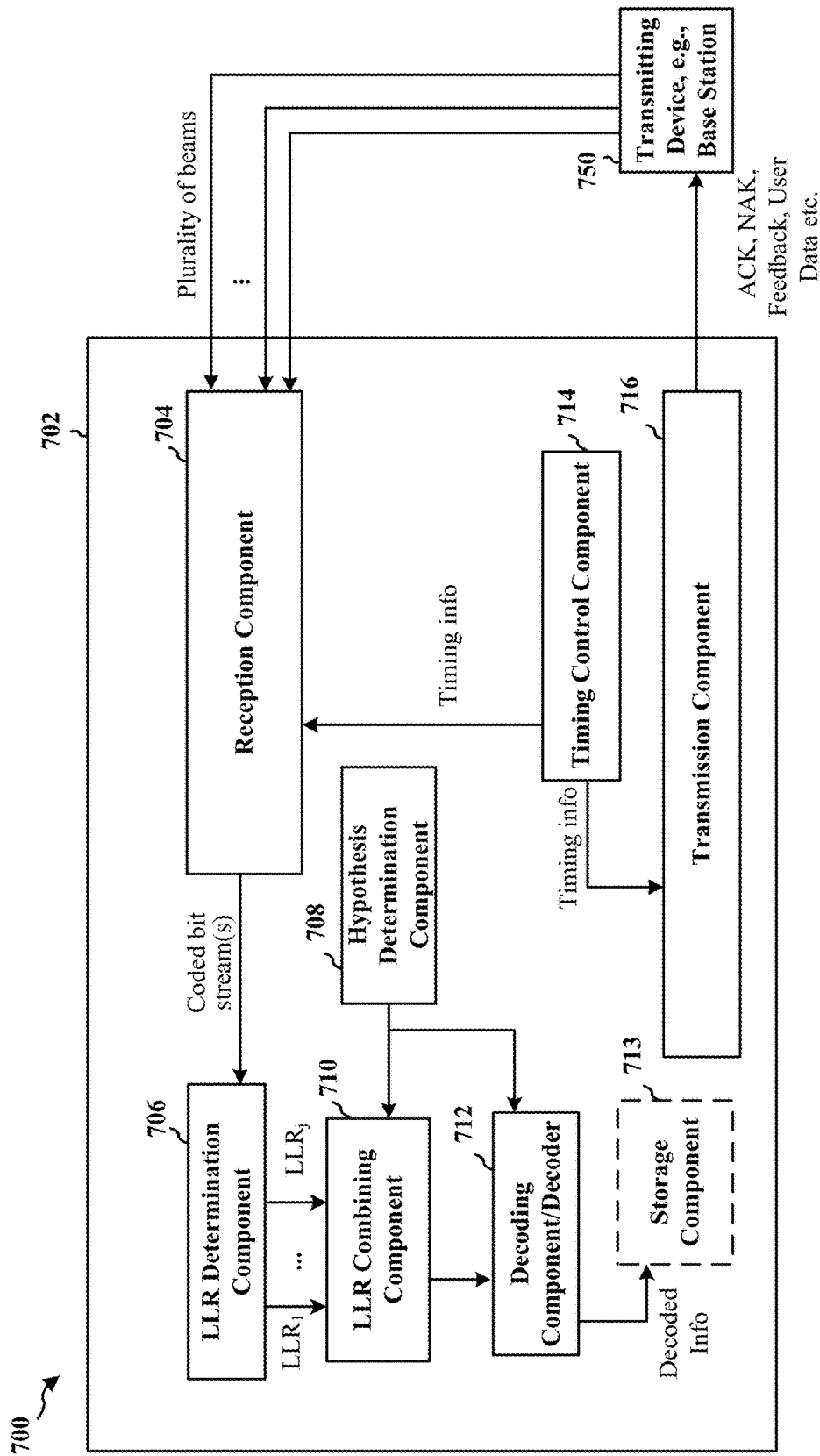
FIG. 7 is a conceptual data flow diagram illustrating the data flow between different means/components in an exemplary apparatus.

FIG. 7 is a conceptual data flow diagram 700 illustrating the data flow between different means/components in an exemplary apparatus 702. The apparatus 702 may be UE, e.g., UE 104/404/410. The apparatus 702 may include a reception component 704, an LLR determination component 706, a hypothesis determination component 708, an LLR combining component 710, a decoding component (decoder) 712, a storage component 713, a timing control component 714, and a transmission component 716.

The reception component 704 may be configured to receive and process signals and/or information from other devices. For example, the received signals and/or information may include broadcast information and beam index information received via beams, user data and/or other messages. The reception component 704 may be configured to receive a first beam and a second beam of a plurality of beams from a base station, e.g., base station 750, the first beam including broadcast information and a first beam index information jointly encoded together, and the second beam including broadcast information and a second beam index information jointly encoded together. For example, referring to FIG. 5, the received plurality of beams may include beams $B_1$ and $B_{i+1}$, each beam communicating broadcast information, e.g., PBCH with MIB, and a beam index of the corresponding beam.

The LLR determination component 706 may be configured to determine LLR of a received bit stream (e.g., on a per bit basis) in accordance with features of various embodiments. In some configurations the LLR determination component 706 is configured to determine a first LLR of the first beam and a second LLR of the second beam. In some configurations the LLR determination component 706 may be further configured to j additional LLRs of j additional beams of the received plurality of beams. The determined LLRs may be provided as input to the LLR combining component 710 in some configurations. The hypothesis determination component 708 may be configured to determine hypotheses of an exclusive OR of the first beam index information with the second beam index information. For example, the XORSets discussed above may be generated by the hypothesis determination component 708.

The LLR combining component 710 may be configured to generate a combined LLR of two or more beams based on a decision as to how many adjacent beams are to be combined for decoding. In some configurations the LLR combining component 710 may be configured to generate a combined LLR in accordance with equation (2), e.g., with the generated combined LLR being equal to $LLR_{B1}+LLR_{B2}$ (1-2(Code($B_1 \oplus B_2$))), where $LLR_{B1}$ is the first LLR, $LLR_{B2}$ is the second LLR, and Code($B_1 \oplus B_2$) is a joint encoding of an exclusive OR of the broadcast information and the first beam index information of the first beam with the broadcast information and the second beam index information of the second beam. In some configurations, ($B_1 \oplus B_2$) is a hypothesis determined by the hypothesis determination component 708.

The decoding component (e.g., decoder) 712 may be configured to decode the broadcast information and beam index information in a received beam based on LLRs of at least two received adjacent beams. For example, in some configurations the decoder 712 may be configured to decode the broadcast information and the first beam index information in the first beam based on both the first LLR and the second LLR. In some configurations decoder 712 is configured to decode the broadcast information and the first beam index information in the first beam based on an LLR that is a function of the first LLR and the second LLR. In some configurations decoder 712 is configured to decode the broadcast information and the first beam index information in the first beam is decoded based on a combined LLR (e.g., $LLR_{B1}+LLR_{B2}$(1-2×Code($B_1 \oplus B_2$))) generated by the LLR combining component 710.

In some configurations the decoder 712 is configured to decode broadcast information and the first beam index information in the first beam by blind decoding the broadcast information and the first beam index information in the first beam based on the first LLR, the second LLR, and bit value hypotheses of an exclusive OR of the first beam index information with the second beam index information. In some such configurations the LLR combining component 710 may be implemented as part of the decoder 712. In some such configurations the decoder 712 is configured to determine, for each unique hypothesis in determined hypotheses (e.g., a set of multiple hypotheses determined by the component 708), a combined LLR based on the first LLR, the second LLR, and the unique hypothesis. In some such configurations the decoder 712 receives the first and second LLRs from the LLR determination component 706 and the bit value hypotheses of the XOR of the first beam index information with the second beam index information from the hypotheses determination component 708 and uses the information to perform the decoding. In some configurations the decoder 712 is configured to blind decode, for each unique hypothesis of the hypotheses (e.g., hypotheses set generated by the hypotheses determination component 708), the broadcast information and the first beam index information based on the determined combined LLR. In some configurations the decoder 712 is further configured to determine a successful blind decoding of the broadcast information and the first beam index information.

In some configurations the decoder 712 may be further configured to decode the broadcast information and the first beam index information in the first beam based on j additional LLRs, which are in addition to the first and second LLR. In some such configurations the broadcast information and the first beam index information in the first beam is decoded based on M blind decodings, where M is equal to $2^j/(\log 2(N)-j)$ and N is a number of bit value hypotheses of an exclusive OR of the beam index information of the first beam, the second beam, and the j additional beams.

The timing control component 714 may be configured to provide transmission/reception timing information to the transmission and reception components 716 and 704, respectively, to control transmission and reception of data and/or control information. The transmission component 716 may be configured to transmit information, e.g., ACKs, NAKs, beacons, user data and/or control signals, to the base station 750 and/or other UEs.

The apparatus may include additional components that perform each of the blocks of the algorithm in the aforementioned flowchart of FIG. 6. As such, each block in the aforementioned flowchart of FIG. 6 may be performed by a component and the apparatus may include one or more of those components. The components may be one or more hardware components specifically configured to carry out the stated processes/algorithm, implemented by a processor configured to perform the stated processes/algorithm, stored within a computer-readable medium for implementation by a processor, or some combination thereof.

Figure 8:
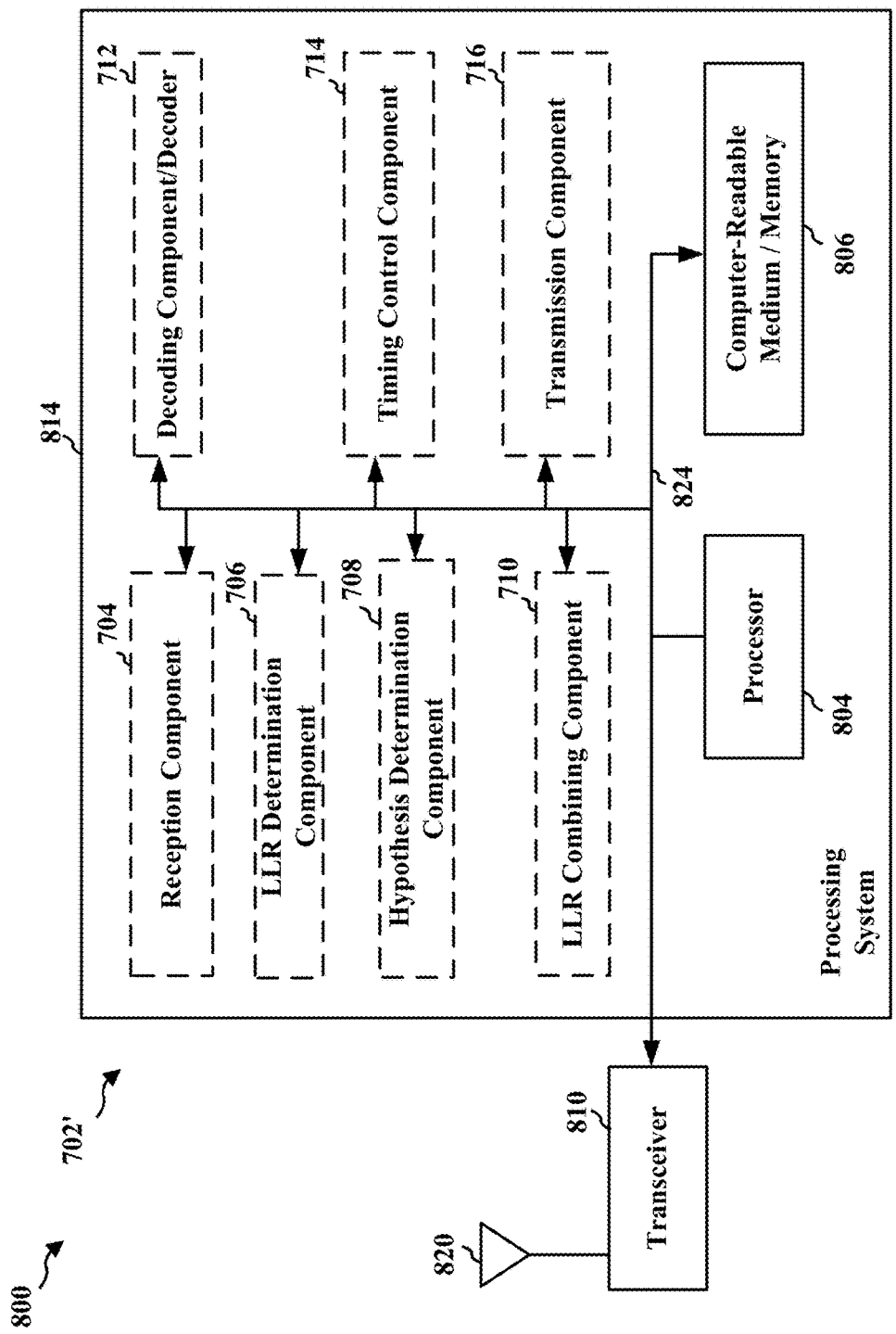
FIG. 8 is a diagram illustrating an example of a hardware implementation for an apparatus employing a processing system.

FIG. 8 is a diagram 800 illustrating an example of a hardware implementation for an apparatus 702' employing a processing system 814. The processing system 814 may be implemented with a bus architecture, represented generally by the bus 824. The bus 824 may include any number of interconnecting buses and bridges depending on the specific application of the processing system 814 and the overall design constraints. The bus 824 links together various circuits including one or more processors and/or hardware components, represented by the processor 804, the components 704, 706, 708, 710, 712, 714, 716, and the computer-readable medium/memory 806. The bus 824 may also link various other circuits such as timing sources, peripherals, voltage regulators, and power management circuits, which are well known in the art, and therefore, will not be described any further.

The processing system 814 may be coupled to a transceiver 810. The transceiver 810 may include individual transmitter and receiver circuits in some configurations. The transceiver 810 is coupled to one or more antennas 820. The transceiver 810 provides a means for communicating with various other apparatus over a transmission medium. The transceiver 810 receives a signal from the one or more antennas 820, extracts information from the received signal, and provides the extracted information to the processing system 814, specifically the reception component 704. In addition, the transceiver 810 receives information from the processing system 814, specifically the transmission component 716, and based on the received information, generates a signal to be applied to the one or more antennas 820. The processing system 814 includes a processor 804 coupled to a computer-readable medium/memory 806. The processor 804 is responsible for general processing, including the execution of software stored on the computer-readable medium/memory 806. The software, when executed by the processor 804, causes the processing system 814 to perform the various functions described supra for any particular apparatus. The computer-readable medium/memory 806 may also be used for storing data that is manipulated by the processor 804 when executing software. The processing system 814 further includes at least one of the components 704, 706, 708, 710, 712, 714, 716. The components may be software components running in the processor 804, resident/stored in the computer-readable medium/memory 806, one or more hardware components coupled to the processor 804, or some combination thereof.

In one configuration, the apparatus 702/702' for wireless communication includes means for receiving a first beam and a second beam of a plurality of beams from a base station. The first beam includes broadcast information and a first beam index information jointly encoded together, and the second beam includes broadcast information and a second beam index information jointly encoded together. The apparatus 702/702' may further include means for determining a LLR, the means for determining the LLR being configured to determine a first LLR of the first beam and a second LLR of the second beam, and means for decoding the broadcast information and the first beam index information in the first beam based on both the first LLR and the second LLR. In some configurations, the means for decoding is configured to decode the broadcast information and the first beam index information in the first beam based on an LLR that is a function of the first LLR and the second LLR. In some configurations, the means for decoding is further configured to decode the broadcast information and the first beam index information in the first beam based on a combined LLR equal to $LLR_{B1}+LLR_{B2}(1-2(Code(B_1 \oplus B_2)))$, where $LLR_{B1}$ is the first LLR, $LLR_{B2}$ is the second LLR, and $Code(B_1 \oplus B_2)$ is a joint encoding of an exclusive OR of the broadcast information and the first beam index information of the first beam ($B_1$) with the broadcast information and the second beam index information of the second beam ($B_2$). In some configurations, the means for decoding is configured to decode broadcast information and the first beam index information in the first beam by blind decoding the broadcast information and the first beam index information in the first beam based on the first LLR, the second LLR, and bit value hypotheses of an exclusive OR of the first beam index information with the second beam index information.

In some configurations, the means for decoding the broadcast information and the first beam index information is further configured to: determine, for each unique bit value hypothesis of the bit value hypotheses, a combined LLR based on the first LLR, the second LLR, and the unique bit value hypothesis. The means for decoding may be further configured to blind decode, for each unique bit value hypothesis of the bit value hypotheses, the broadcast information and the first beam index information based on the determined combined LLR, and determine a successful blind decoding of the broadcast information and the first beam index information. In some embodiments a number of bit value hypothesis in the bit value hypotheses is X, and a number of the unique bit value hypothesis is M, where M<X In some embodiments M is equal to $\log_2(X)$.

In some configurations, the means for determining the LLR is further configured to determine j additional LLRs of j additional beams of the received plurality of beams. In some such configurations the means for decoding is configured to decode the broadcast information and the first beam index information further based on the j additional LLRs, e.g., by decoding based on a combined LLR of the first beam, the second beam, and the j additional beams combined in the manner discussed above. In some configurations, the broadcast information and the first beam index information in the first beam is decoded based on M blind decodings, where M is equal to $2^j(\log 2(N)-j)$ and N is a number of bit value hypotheses of an exclusive OR of the beam index information of the first beam, the second beam, and the j additional beams.

The aforementioned means may be one or more of the aforementioned components of the apparatus 702 and/or the processing system 814 of the apparatus 702' configured to perform the functions recited by the aforementioned means. In some embodiments the processing system 814 may include the TX Processor 368, the RX Processor 356, and the controller/processor 359. As such, in one configuration, the aforementioned means may be the TX Processor 368, the RX Processor 356, and the controller/processor 359 configured to perform the functions recited by the aforementioned means.

It is understood that the specific order or hierarchy of blocks in the processes/flowcharts disclosed is an illustration of exemplary approaches. Based upon design preferences, it is understood that the specific order or hierarchy of blocks in the processes/flowcharts may be rearranged. Further, some blocks may be combined or omitted. The accompanying method claims present elements of the various blocks in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects. Unless specifically stated otherwise, the term "some" refers to one or more. Combinations such as "at least one of A, B, or C," "one or more of A, B, or C," "at least one of A, B, and C," "one or more of A, B, and C," and "A, B, C, or any combination thereof" include any combination of A, B, and/or C, and may include multiples of A, multiples of B, or multiples of C. Specifically, combinations such as "at least one of A, B, or C," "one or more of A, B, or C," "at least one of A, B, and C," "one or more of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. The words "module," "mechanism," "element," "device," and the like may not be a substitute for the word "means." As such, no claim element is to be construed as a means plus function unless the element is expressly recited using the phrase "means for."

What is claimed is:

1. A method of wireless communication of a user equipment (UE), comprising:
    receiving a first beam and a second beam of a plurality of beams from a base station, the first beam including broadcast information and a first beam index information jointly encoded together, and the second beam including broadcast information and a second beam index information jointly encoded together;
    determining a first log likelihood ratio (LLR) of the first beam;
    determining a second LLR of the second beam; and
    decoding the broadcast information and the first beam index information in the first beam based on both the first LLR and the second LLR.

2. The method of claim 1, wherein the first beam and the second beam are adjacent beams.

3. The method of claim 2, further comprising: receiving a third beam of the plurality of beams, the third beam being adjacent to one of the first beam or the second beam.

4. The method of claim 1, wherein the first beam and the second beam are received through a beam sweep.

5. The method of claim 1, wherein the broadcast information and the first beam index information in the first beam is decoded based on an LLR that is a function of the first LLR and the second LLR.

6. The method of claim 5, wherein the broadcast information and the first beam index information in the first beam is decoded based on a combined LLR equal to $LLRB1+LLRB2(1-2(\text{Code}(B1 \oplus B2)))$, where LLRB1 is the first LLR, LLRB2 is the second LLR, and $\text{Code}(B1 \oplus B2)$ is a joint encoding of an exclusive OR of the broadcast information and the first beam index information of the first beam (B1) with the broadcast information and the second beam index information of the second beam (B2).

7. The method of claim 1, wherein the decoding broadcast information and the first beam index information in the first beam comprises blind decoding the broadcast information and the first beam index information in the first beam based on the first LLR, the second LLR, and bit value hypotheses of an exclusive OR of the first beam index information with the second beam index information.

8. The method of claim 7, wherein the decoding broadcast information and the first beam index information comprises:
    determining, for each unique bit value hypothesis of the bit value hypotheses, a combined LLR based on the first LLR, the second LLR, and the unique bit value hypothesis;
    blind decoding, for each unique bit value hypothesis of the bit value hypotheses, the broadcast information and the first beam index information based on the determined combined LLR; and
    determining a successful blind decoding of the broadcast information and the first beam index information.

9. The method of claim 8, wherein a number of bit value hypothesis in the bit value hypotheses is X, and a number of the unique bit value hypothesis is M, where M<X.

10. The method of claim 9, wherein M is equal to $\log2(X)$.

11. The method of claim 1, further comprising determining j additional LLRs of j additional beams of the received plurality of beams, wherein the broadcast information and the first beam index information in the first beam is decoded further based on the j additional LLRs.

12. The method of claim 11, wherein the broadcast information and the first beam index information in the first beam is decoded based on M blind decodings, where M is equal to $2j(\log2(N)-j)$ and N is a number of bit value hypotheses of an exclusive OR of the first beam index information, the second beam index information, and beam index information of the j additional beams.

13. An apparatus for wireless communication, comprising:
    means for receiving a first beam and a second beam of a plurality of beams from a base station, the first beam including broadcast information and a first beam index information jointly encoded together, and the second beam including broadcast information and a second beam index information jointly encoded together;
    means for determining a log likelihood ratio (LLR), said means for determining the LLR being configured to determine a first LLR of the first beam and a second LLR of the second beam; and means for decoding the broadcast information and the first beam index information in the first beam based on both the first LLR and the second LLR.

14. The apparatus of claim 13, wherein the means for decoding is configured to decode the broadcast information and the first beam index information in the first beam based on an LLR that is a function of the first LLR and the second LLR.

15. The apparatus of claim 14, wherein the means for decoding is further configured to decode the broadcast information and the first beam index information in the first beam based on a combined LLR equal to $LLR_{B1}+LLR_{B2}(1-2(Code(B_1 \oplus B_2)))$, where $LLR_{B1}$ is the first LLR, $LLR_{B2}$ is the second LLR, and $Code(B_1 \oplus B_2)$ is a joint encoding of an exclusive OR of the broadcast information and the first beam index information of the first beam ($B_1$) with the broadcast information and the second beam index information of the second beam ($B_2$).

16. The apparatus of claim 13, wherein the means for decoding is configured to decode broadcast information and the first beam index information in the first beam by blind decoding the broadcast information and the first beam index information in the first beam based on the first LLR, the second LLR, and bit value hypotheses of an exclusive OR of the first beam index information with the second beam index information.

17. The apparatus of claim 16, wherein the means for decoding the broadcast information and the first beam index information is further configured to:
   determine, for each unique bit value hypothesis of the bit value hypotheses, a combined LLR based on the first LLR, the second LLR, and the unique bit value hypothesis;
   blind decode, for each unique bit value hypothesis of the bit value hypotheses, the broadcast information and the first beam index information based on the determined combined LLR; and
   determine a successful blind decoding of the broadcast information and the first beam index information.

18. The apparatus of claim 17, wherein a number of bit value hypothesis in the bit value hypotheses is X, and a number of the unique bit value hypothesis is M, where M<X, wherein M is equal to $\log_2(X)$.

19. The apparatus of claim 13, wherein said means for determining the LLR being further configured to determine j additional LLRs of j additional beams of the received plurality of beams, wherein the means for decoding is configured to decode the broadcast information and the first beam index information further based on the j additional LLRs.

20. The apparatus of claim 19, wherein the broadcast information and the first beam index information in the first beam is decoded based on M blind decodings, where M is equal to $2^j(\log 2(N)-j)$ and N is a number of bit value hypotheses of an exclusive OR of the first beam index information, the second beam index information, and beam index information of the j additional beams.

21. An apparatus for wireless communication, comprising:
   a memory; and
   at least one processor coupled to the memory and configured to:
      receive a first beam and a second beam of a plurality of beams from a base station, the first beam including broadcast information and a first beam index information jointly encoded together, and the second beam including broadcast information and a second beam index information jointly encoded together;
      determine a first log likelihood ratio (LLR) of the first beam;
      determine a second LLR of the second beam; and
      decode the broadcast information and the first beam index information in the first beam based on both the first LLR and the second LLR.

22. The apparatus of claim 21, wherein the at least one processor is further configured to decode the broadcast information and the first beam index information in the first beam based on an LLR that is a function of the first LLR and the second LLR.

23. The apparatus of claim 22, wherein the at least one processor is further configured to decode the broadcast information and the first beam index information in the first beam based on a combined LLR equal to $LLR_{B1}+LLR_{B2}(1-2(Code(B_1 \oplus B_2)))$, where $LLR_{B1}$ is the first LLR, $LLR_{B2}$ is the second LLR, and $Code(B_1 \oplus B_2)$ is a joint encoding of an exclusive OR of the broadcast information and the first beam index information of the first beam ($B_1$) with the broadcast information and the second beam index information of the second beam ($B_2$).

24. The apparatus of claim 21, wherein the at least one processor is further configured to blind decoding the broadcast information and the first beam index information in the first beam based on the first LLR, the second LLR, and bit value hypotheses of an exclusive OR of the first beam index information with the second beam index information, as part of being configured to decode broadcast information and the first beam index information in the first beam.

25. The apparatus of claim 24, wherein the at least one processor is further configured to:
   determine, for each unique bit value hypothesis of the bit value hypotheses, a combined LLR based on the first LLR, the second LLR, and the unique bit value hypothesis;
   blind decode, for each unique bit value hypothesis of the bit value hypotheses, the broadcast information and the first beam index information based on the determined combined LLR; and
   determine a successful blind decoding of the broadcast information and the first beam index information.

26. The apparatus of claim 25, wherein a number of bit value hypothesis in the bit value hypotheses is X, and a number of the unique bit value hypothesis is M, where M<X.

27. The apparatus of claim 26, wherein M is equal to $\log_2(X)$.

28. The apparatus of claim 21, wherein the at least one processor is further configured to determine j additional LLRs of j additional beams of the received plurality of beams, and decode the broadcast information and the first beam index information further based on the j additional LLRs.

29. The apparatus of claim 28, wherein the at least one processor is further configured to decode the broadcast information and the first beam index information in the first beam based on M blind decodings, where M is equal to $2^j(\log 2(N)-j)$ and N is a number of bit value hypotheses of an exclusive OR of the first beam index information, the second beam index information, and beam index information of the j additional beams.

30. A non-transitory computer readable medium of a user equipment (UE) storing computer executable code, comprising code to:
   receive a first beam and a second beam of a plurality of beams from a base station, the first beam including broadcast information and a first beam index information jointly encoded together, and the second beam including broadcast information and a second beam index information jointly encoded together;
determine a first log likelihood ratio (LLR) of the first beam;
determine a second LLR of the second beam; and
decode the broadcast information and the first beam index information in the first beam based on both the first LLR and the second LLR.

* * * * *